(12) United States Patent
Derrickson et al.

(10) Patent No.: US 12,464,745 B2
(45) Date of Patent: Nov. 4, 2025

(54) BIPOLAR JUNCTION TRANSISTOR ARRAYS

(71) Applicant: GlobalFoundries U.S. Inc., Malta, NY (US)

(72) Inventors: Alexander Derrickson, Saratoga Springs, NY (US); Venkatesh Gopinath, Fremont, CA (US); John J. Pekarik, Underhill, VT (US); Hong Yu, Clifton Park, NY (US); Vibhor Jain, Essex Junction, VT (US); David Pritchard, Glenville, NY (US)

(73) Assignee: GlobalFoundries U.S. Inc., Malta, NY (US)

( * ) Notice: Subject to any disclaimer, the term of this patent is extended or adjusted under 35 U.S.C. 154(b) by 425 days.

(21) Appl. No.: 17/990,898

(22) Filed: Nov. 21, 2022

(65) Prior Publication Data

US 2024/0170560 A1    May 23, 2024

(51) Int. Cl.
*H01L 23/528* (2006.01)
*H10D 10/40* (2025.01)
(Continued)

(52) U.S. Cl.
CPC ............ *H10D 10/60* (2025.01); *H10D 10/40* (2025.01); *H10D 30/0614* (2025.01); *H10D 84/401* (2025.01)

(58) Field of Classification Search
CPC .... H10D 10/60; H10D 10/40; H10D 30/0614; H10D 84/401; H10D 84/60;
(Continued)

(56) References Cited

U.S. PATENT DOCUMENTS 8,687,403 B1 * 4/2014 Derhacobian ........ G11C 14/009
                                                      365/100
9,991,368 B2   6/2018 Ting et al.
(Continued)

OTHER PUBLICATIONS

European Patent Office; Decision to Grant a European Patent Pursuant to Article 97(1) EPC issued in European Patent Application No. 23197829.7 on Jan. 8, 2025; 2 pages.
(Continued)

*Primary Examiner* — Samuel Park
(74) *Attorney, Agent, or Firm* — Thompson Hine LLP; David Cain

(57) ABSTRACT

Structures that include bipolar junction transistors and methods of forming such structures. The structure comprises a semiconductor layer, a substrate, and a dielectric layer disposed between the semiconductor layer and the substrate. The structure further comprises a first bipolar junction transistor including a first collector in the substrate, a first emitter, and a first base layer. The first base layer extends through the dielectric layer from the first emitter to the first collector. The structure further comprises a second bipolar junction transistor including a second collector in the substrate, a second emitter, and a second base layer. The second base layer extends through the dielectric layer from the second emitter to the second collector. The second base layer is connected to the first base layer by a section of the semiconductor layer to define a base line.

20 Claims, 6 Drawing Sheets

(51) Int. Cl.
  *H10D 10/60* (2025.01)
  *H10D 30/01* (2025.01)
  *H10D 84/40* (2025.01)
(58) Field of Classification Search
  CPC .. H10N 70/826; H10N 70/8833; H10N 70/20; H10N 70/883; H10B 63/80; H10B 61/20; H10B 63/32
  See application file for complete search history.

(56) References Cited

U.S. PATENT DOCUMENTS

| | | |
|---|---|---|
| 10,115,810 B2 | 10/2018 | Liu et al. |
| 10,916,642 B2 | 2/2021 | Jain et al. |
| 2005/0169043 A1 | 8/2005 | Yokoyama et al. |
| 2006/0289942 A1 | 12/2006 | Horii et al. |
| 2009/0285015 A1 | 11/2009 | Ha et al. |
| 2012/0168907 A1 | 7/2012 | Malladi et al. |
| 2013/0277753 A1* | 10/2013 | Clark, Jr. ............... H10D 86/01 438/234 |
| 2014/0154857 A1 | 6/2014 | Tilke |
| 2014/0327111 A1 | 11/2014 | Camillo-Castillo et al. |
| 2015/0021738 A1 | 1/2015 | Camillo-Castillo et al. |
| 2015/0123245 A1* | 5/2015 | Benoit ................. H10D 62/137 257/565 |
| 2016/0163685 A1 | 6/2016 | Jain et al. |
| 2016/0211345 A1 | 7/2016 | Ding et al. |
| 2017/0287978 A1* | 10/2017 | Toh ........................ G11C 11/161 |
| 2019/0137546 A1 | 5/2019 | Krishnamurthy et al. |
| 2019/0312125 A1 | 10/2019 | Reznicek et al. |
| 2019/0363076 A1 | 11/2019 | Hwang |
| 2020/0381480 A1* | 12/2020 | Reznicek ............. H10D 62/822 |
| 2023/0275083 A1 | 8/2023 | Malinowski et al. |
| 2023/0326919 A1 | 10/2023 | Chiu et al. |
| 2024/0147736 A1 | 5/2024 | Gopinath et al. |
| 2024/0170560 A1 | 5/2024 | Derrickson et al. |

OTHER PUBLICATIONS

F. Arnaud et al., "High Density Embedded PCM Cell in 28nm FDSOI Technology for Automotive Micro-Controller Applications," 2020 IEEE International Electron Devices Meeting (IEDM), 2020, pp. 24.2.1-24.2.4, doi: 10.1109/EDM13553.2020.9371934.

F. Disegni et al., "16MB High Density Embedded PCM macrocell for automotive-grade microcontroller in 28nm FD-SOI, featuring extension to 24MB for Over-The-Air software update," 2021 Symposium on VLSI Circuits, 2021, pp. 1-2, doi: 10.23919/VLSICircuits52068.2021.9492465.

F. Disegni et al., "Embedded PCM macro for automotive-grade microcontroller in 28nm FD-SOI," 2019 Symposium on VLSI Circuits, 2019, pp. C204-C205, doi: 10.23919/VLSIC.2019.8778129.

European Patent Office, Communication under Rule 71(3) EPC Intent to Grant, issued in European Patent Application No. 23198101.0 on Feb. 7, 2025; 8 pages.

Pekarik, John J. et al., "Array Arrangements of Vertical Bipolar Junction Transistors" filed on Nov. 21, 2022 as a U.S. Appl. No. 17/990,800.

European Patent Office, Extended European Search Report and Opinion issued in European Patent Application No. 23198101.0 on Mar. 13, 2024; 11 pages.

European Patent Office, Extended European Search Report and Opinion issued in European Patent Application No. 23197829.7 on Mar. 5, 2024; 13 pages.

European Patent Office, Decision to Grant a European Patent pursuant to Article 97(1) EPC, issued in European Patent Application No. 23198101.0 on Apr. 17, 2025; 2 pages.

U.S. Patent and Trademark Office, Non-Final Office Action issued in U.S. Appl. No. 17/990,800 on Jul. 11, 2025; 9 pages.

\* cited by examiner

BIPOLAR JUNCTION TRANSISTOR ARRAYS

BACKGROUND

This disclosure relates to integrated circuits and semiconductor device fabrication and, more specifically, to structures that include bipolar junction transistors and methods of forming such structures.

A bipolar junction transistor is a three-terminal electronic device that includes an emitter, a collector, and an intrinsic base defining respective junctions with the emitter and collector. In a PNP bipolar junction transistor, the emitter and collector are comprised of p-type semiconductor material, and the intrinsic base is comprised of n-type semiconductor material. In an NPN bipolar junction transistor, the emitter and collector are comprised of n-type semiconductor material, and the intrinsic base is comprised of p-type semiconductor material. In operation, the base-emitter junction is forward biased, the base-collector junction is reverse biased, and the collector-emitter current may be controlled with the base-emitter voltage.

A heterojunction bipolar transistor is a variant of a bipolar junction transistor in which the semiconductor materials have different energy bandgaps, which creates heterojunctions. For example, the collector and emitter of a heterojunction bipolar transistor may be constituted by silicon, and the intrinsic base of a heterojunction bipolar transistor may be constituted by silicon-germanium, which is characterized by a narrower band gap than silicon. Heterojunction bipolar transistors may exhibit improvements in high frequency performance as a result of the introduction of heterojunctions.

A resistive random-access memory device provides one type of embedded non-volatile memory technology. A bitcell of a resistive random-access memory device includes a resistive memory element and an access transistor that controls operations used to write, erase, and read the resistive memory element. Because resistive memory elements are non-volatile, bits of data are retained as stored content by the resistive memory elements when the resistive random-access memory device is not powered. The non-volatility of a resistive random-access memory device contrasts with volatile memory technologies, such as a static random-access memory device in which the stored content is eventually lost when unpowered and a dynamic random-access memory device in which the stored content is lost unless periodically refreshed.

Field-effect transistors are commonly used as access transistors in a resistive random-access memory device. Reliable operation of the bitcell of a resistive random-access memory device imposes restrictions on the field-effect transistors. For example, the minimum voltage and drive current requirements imposed on the field-effect transistors restrict the ability to shrink the bitcell dimensions. As a result, the scalability of the bitcell is restricted.

Improved structures that include bipolar junction transistors and methods of forming such structures are needed.

SUMMARY

According to an embodiment of the invention, a structure comprises a semiconductor layer, a substrate, and a dielectric layer disposed between the semiconductor layer and the substrate. The structure further comprises a first bipolar junction transistor including a first collector in the substrate, a first emitter, and a first base layer positioned between the first collector and the first emitter. The first base layer extends through the dielectric layer from the first emitter to the first collector. The structure further comprises a second bipolar junction transistor including a second collector in the substrate, a second emitter, and a second base layer positioned between the second collector and the second emitter. The second base layer extends through the dielectric layer from the second emitter to the second collector. The second base layer is connected to the first base layer by a section of the semiconductor layer to define a base line.

According to an embodiment of the invention, a method comprises forming a first bipolar junction transistor including a first collector in a substrate, a first emitter, and a first base layer positioned between the first collector and the first emitter. A dielectric layer is disposed between the substrate and an overlying semiconductor layer, and the first base layer extends through the dielectric layer from the first emitter to the first collector. The method further comprises forming a second bipolar junction transistor including a second collector in the substrate, a second emitter, and a second base layer positioned between the second collector and the second emitter. The second base layer extends through the dielectric layer from the second emitter to the second collector. The second base layer is connected to the first base layer by a section of the semiconductor layer to define a base line.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
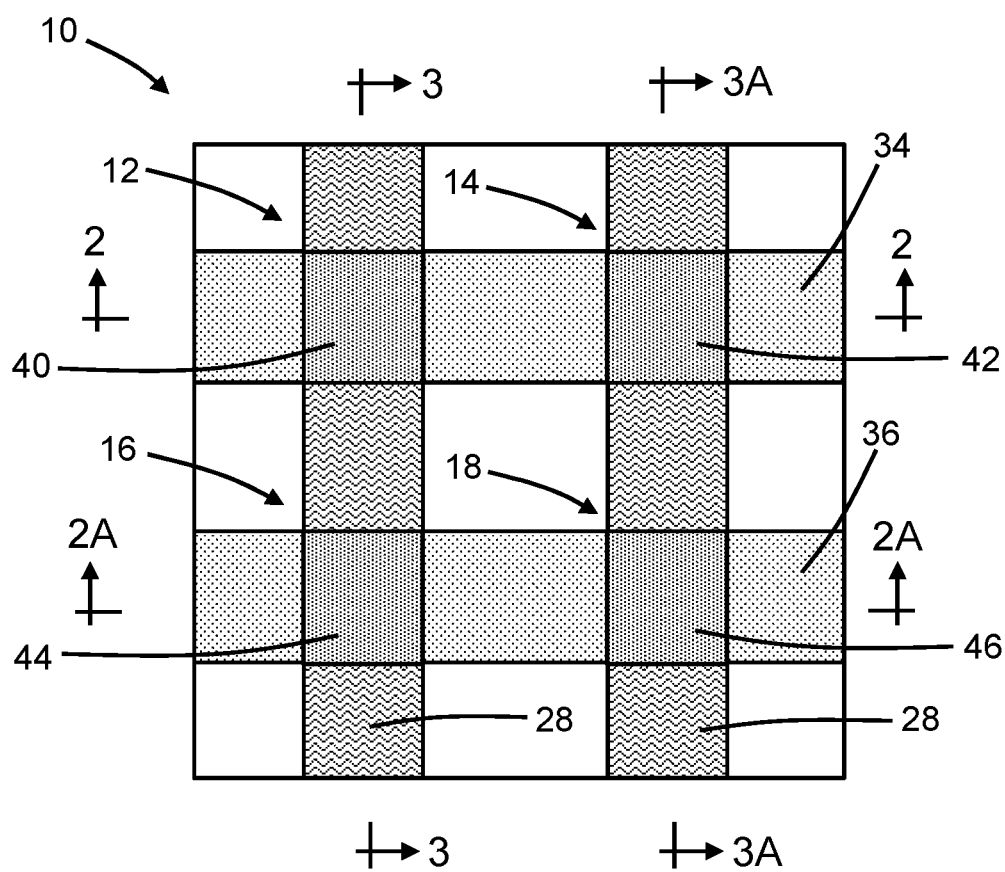
FIG. 1 is a diagrammatic top view illustrating a structure including an array of bipolar junction transistors at an initial stage of a fabrication method in accordance with embodiments of the invention.

With reference to FIGS. 1, 2, 2A, 3, 3A and in accordance with embodiments of the invention, a structure 10 for a resistive random-access memory device includes an array of bipolar junction transistors 12, 14, 16, 18 that may be fabricated using a silicon-on-insulator substrate that includes a semiconductor layer 28, a substrate 32, and a dielectric layer 30 disposed between the semiconductor layer 28 and the substrate 32. The semiconductor layer 28 may be comprised of a semiconductor material, such as single-crystal silicon, and may be lightly doped with a p-type dopant. The dielectric layer 30 may be comprised of a dielectric material, such as silicon dioxide, that is an electrical insulator. The substrate 32 may be comprised of a semiconductor material, such as silicon, and the substrate 32 may be lightly doped with a p-type dopant. The dielectric layer 30 has an upper interface 13 with the semiconductor layer 28, the dielectric layer 30 has a lower interface 15 with the substrate 32, and the upper and lower interfaces 13, 15 may be separated by the thickness of the dielectric layer 30. Field-effect transistors (not shown) may be fabricated by CMOS processes in a region of the silicon-on-insulator substrate different from the region including the bipolar junction transistors 12, 14, 16, 18. In an embodiment, the semiconductor layer 28 may have a thickness suitable to fabricate fully-depleted silicon-on-insulator (FDSOI) field-effect transistors. In an embodiment, the semiconductor layer 28 may have a thickness in a range of about 2 nanometers (nm) to about 20 nm. In an embodiment, the dielectric layer 30 may have a thickness in a range of about 10 nm to about 50 nm.

Wells 34, 36 may be formed as doped regions in the substrate 32 that are positioned in a vertical direction beneath the interface 15 between the dielectric layer 30 and the substrate 32. In an embodiment, the wells 34, 36 may adjoin the interface 15 between the dielectric layer 30 and the substrate 32. In an embodiment, the wells 34, 36 may longitudinally extend as stripes of doped semiconductor material, and the well 34 may be aligned parallel to the well 36. The semiconductor material constituting the wells 34, 36 may have an opposite conductivity type from the semiconductor material constituting the substrate 32. A portion of the substrate 32 is arranged in a lateral direction between the well 34 and the well 36, and the oppositely-doped portion of the substrate 32 may electrically isolate the well 34 from the well 36. The wells 34, 36 may be contacted at an edge of the transistor array.

The wells 34, 36 may be formed in the substrate 32 by introducing a dopant by, for example, ion implantation with given implantation conditions. A patterned implantation mask may be formed to define selected areas that are exposed for the implantation of ions. The implantation mask may include a layer of an organic photoresist that is applied and patterned to form openings exposing the selected areas and determining, at least in part, the location and horizontal dimensions of the wells 34, 36. The implantation mask has a thickness and stopping power sufficient to block the implantation of ions in masked areas. The implantation conditions (e.g., ion species, dose, kinetic energy) may be selected to tune the electrical and physical characteristics of the wells 34, 36. In an embodiment, the wells 34, 36 may be doped with a concentration of an n-type dopant (e.g., arsenic or phosphorus) such that the wells 34, 36 have n-type conductivity.

The bipolar junction transistor 12 includes a base layer 20 that adjoins an underlying portion of the well 34, and the adjoined portion of the well 34 may define a collector of the bipolar junction transistor 12. The bipolar junction transistor 14 includes a base layer 22 that adjoins an underlying portion of the well 34, and the adjoined portion of the well 34 may define a collector of the bipolar junction transistor 14. The base layer 20 is connected to the base layer 22 by a section of the semiconductor layer 28, and the base layers 20, 22 may be connected to adjacent base layers (not shown) by respective sections of the semiconductor layer 28 to define a base line 78 that may be contacted at an edge of the array. The bipolar junction transistor 16 includes a base layer 24 that adjoins an underlying portion of the well 36, and the adjoined portion of the well 36 may define a collector of the bipolar junction transistor 16. The bipolar junction transistor 18 includes a base layer 26 that adjoins an underlying portion of the well 36, and the adjoined portion of the well 36 may define a collector of the bipolar junction transistor 18. The base layer 24 is connected to the base layer 26 by a section of the semiconductor layer 28, and the base layers 24, 26 may be connected to adjacent base layers (not shown) by respective sections of the semiconductor layer 28 to define a base line 80 that may be contacted at an edge of the array. The base layers 20, 22 may define intrinsic bases of the bipolar junction transistors 12, 14 that adjoin the respective intersected portions of the well 34 along interfaces defining p-n junctions, and the base layers 24, 26 may define intrinsic bases of the bipolar junction transistors 16, 18 that adjoin the respective intersected portions of the well 36 along interfaces defining p-n junctions.

The base layers 20, 22, 24, 26 may be formed by patterning trenches that penetrate through the semiconductor layer 28 and dielectric layer 30 with lithography and etching processes, depositing and planarizing a semiconductor layer to fill the trenches, and forming trench isolation regions 25 positioned between the base layer 20, 22 in one row and the base layers 24, 26 in an adjacent row. In an embodiment, the base layers 20, 22, 24, 26 may be comprised of a semiconductor material that is doped to have an opposite conductivity type from the doped regions providing the wells 34, 36. In an embodiment, the base layers 20, 22, 24, 26 may be comprised of silicon. In an embodiment, the base layers 20, 22, 24, 26 may be comprised of silicon-germanium. In an embodiment, the base layers 20, 22, 24, 26 may be comprised of silicon-germanium containing a germanium content of less than or equal to than 35 atomic percent and the balance silicon. In an embodiment, the base layers 20, 22, 24, 26 may be doped with a concentration a p-type dopant (e.g., boron) such that the base layers 20, 22, 24, 26 have p-type conductivity.

Figure 3:
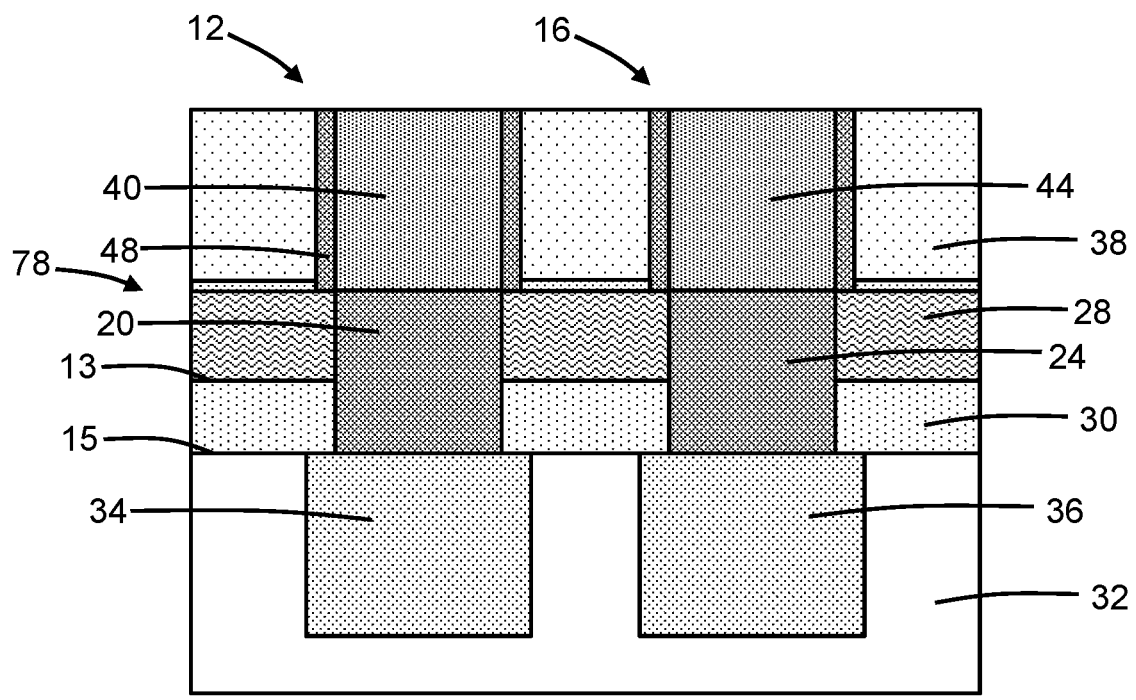
FIG. 3 is a cross-sectional view taken generally along line 3-3 in FIG. 1.
Figure 3A:
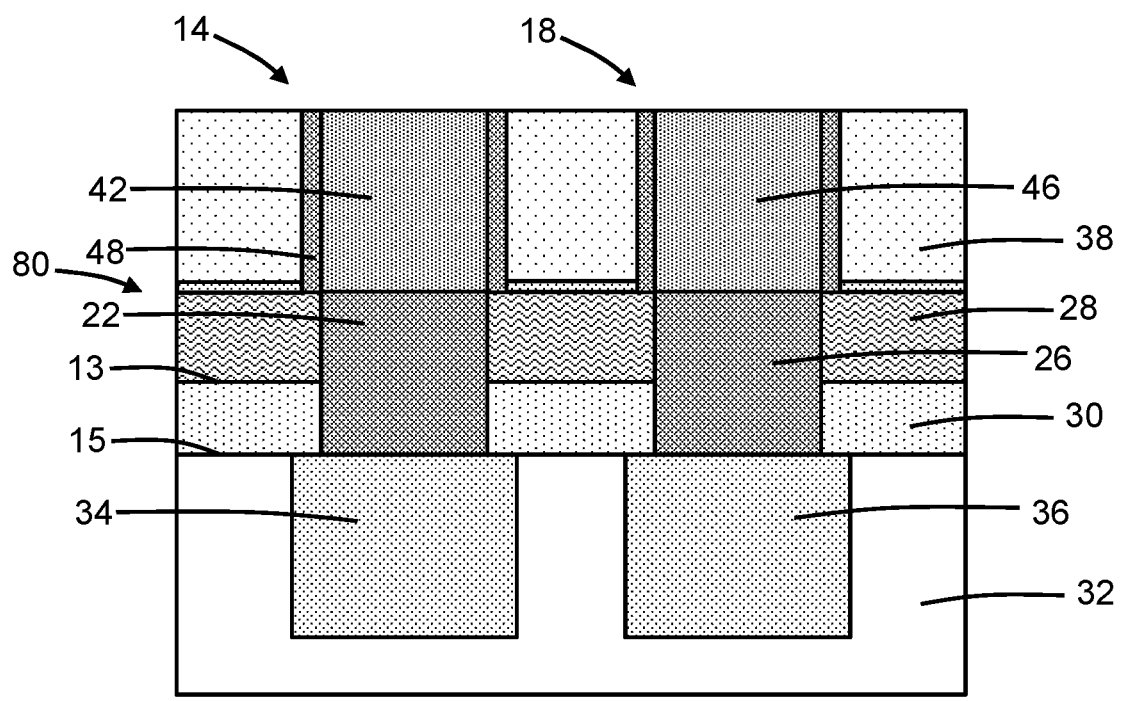
FIG. 3A is a cross-sectional view taken generally along line 3A-3A in FIG. 1.

The base layers 20, 22 extend through the semiconductor layer 28 and the dielectric layer 30 to adjoin the well 34, and the base layers 24, 26 extend through the semiconductor layer 28 and the dielectric layer 30 to adjoin the well 36. In an embodiment, the base layers 20, 22, 24, 26 may extend in a vertical direction fully through the dielectric layer 30 from the level of the interface 13 to the level of the interface 15. In an embodiment, lower portions of the base layers 20, 22, 24, 26 may be coplanar or substantially coplanar with the interface 15. As best shown in FIG. 3, the wells 34, 36 may be longitudinally aligned orthogonal to the base line 78 including the base layer 20, the base layer 24, and the sections of the semiconductor layer 28 connected to the base layers 20, 24. As best shown in FIG. 3A, the wells 34, 36 may be longitudinally aligned orthogonal to the base line 80 including the base layer 22, the base layer 26, and the sections of the semiconductor layer 28 connected to the base layers 22, 26. The sections of the semiconductor layer 28 in the base lines 78, 80 may be doped to have the same conductivity type (e.g., p-type) as the base layers 20, 22, 24, 26, 28, and the sections of the semiconductor layer 28 in the base lines 78, 80 are isolated from the substrate 32 by the dielectric layer 30.

The trench isolation regions 25 electrically isolate the base layers 20, 24 in the base line 78 from the base layers 22, 26 in the base line 80. The trench isolation regions 25 may be formed by patterning shallow trenches with lithography and etching processes, depositing a dielectric material, such as silicon dioxide, to fill the shallow trenches, and planarizing and/or recessing the dielectric material. One of the trench isolation regions 25 is positioned between the base layer 20 and the base layer 22, and another of the trench isolation regions 25 is positioned between the base layer 24 and the base layer 26.

Alignment structures 38 are formed that may be aligned parallel to each other and that may extend parallel to the wells 34, 36. In an embodiment, the alignment structures 38 may be dummy gate structures formed by a CMOS process and that may include a layer of polysilicon stacked on a layer of a dielectric material, such as silicon dioxide. The alignment structures 38 are positioned on the semiconductor layer 28 and, in particular, on the sections of the semiconductor layer 28 participating in the base lines 78, 80. The alignment structures 38 may be electrically non-functional in the bipolar junction transistors 12, 14, 16, 18.

The bipolar junction transistor 12 includes an emitter 40 that adjoins the base layer 20 along an interface defining a p-n junction. The bipolar junction transistor 14 includes an emitter 42 that adjoins the base layer 22 along an interface defining a p-n junction. The bipolar junction transistor 16 includes an emitter 44 that adjoins the base layer 24 along an interface defining a p-n junction. The bipolar junction transistor 18 includes an emitter 46 that adjoins the base layer 26 along an interface defining a p-n junction. One of the trench isolation regions 25 is positioned in a lateral direction between the emitter 40 and the emitter 42, and one of the trench isolation regions 25 is positioned in a lateral direction between the emitter 44 and the emitter 46.

The emitters 40, 42, 44, 46 may be respectively formed as raised semiconductor layers on the base layers 20, 22, 24, 26 at the intersections between the base lines 78, 80 and the wells 34, 36. The base layers 20, 22, 24, 26 are positioned in a vertical direction between the portions of the wells 34, 36 defining the collectors and the emitters 40, 42, 44, 46. In an embodiment, the emitters 40, 42, 44, 46 may be formed by epitaxially growing semiconductor material. The alignment structures 38 and the trench isolation regions 25 may function to self-align the formation of the emitters 40, 42, 44, 46 in a selective epitaxial growth process. In an embodiment, the respective surface areas of the base layers 20, 22, 24, 26 contacted by the emitters 40, 42, 44, 46 are constrained by the alignment structures 38 and the trench isolation regions 25 such that the cross-sectional areas of the emitters 40, 42, 44, 46 in a vertical perspective are equal to the contacted surface areas of the base layers 20, 22, 24, 26. In an embodiment, the semiconductor material of the emitters 40, 42, 44, 46 may be doped to have the same conductivity type as the wells 34, 36 and an opposite conductivity type from the base layers 20, 22, 24, 26. In an embodiment, the semiconductor material of the emitters 40, 42, 44, 46 may be doped (e.g., heavily doped) with a concentration of an n-type dopant (e.g., arsenic or phosphorus) such that the emitters 40, 42, 44, 46 have n-type conductivity.

Spacers 48 may be positioned between the alignment structures 38 and the emitters 40, 42, 44, 46. The spacers 48 may be formed on the alignment structures 38, before forming the emitters 40, 42, 44, 46, by depositing a layer comprised of a dielectric material, such as silicon nitride, that is an electrical insulator and etching the deposited layer with an anisotropic etching process.

The structure 10 may formed in a BiCMOS process with a minimal number of added masks. For example, the formation of the emitters 40, 42, 44, 46 may be shared with the formation of raised sources and drains of field-effect transistors formed on the same chip as the bipolar junction transistors 12, 14, 16, 18. The bipolar junction transistors 12, 14, 16, 18, which have a vertical arrangement of p-n junctions, can be formed with a more compact size than field-effect transistors, which may permit downward scaling in the dimensions of an associated resistive random-access memory device due to the elimination of field-effect transistors as access transistors.

Figure 2:
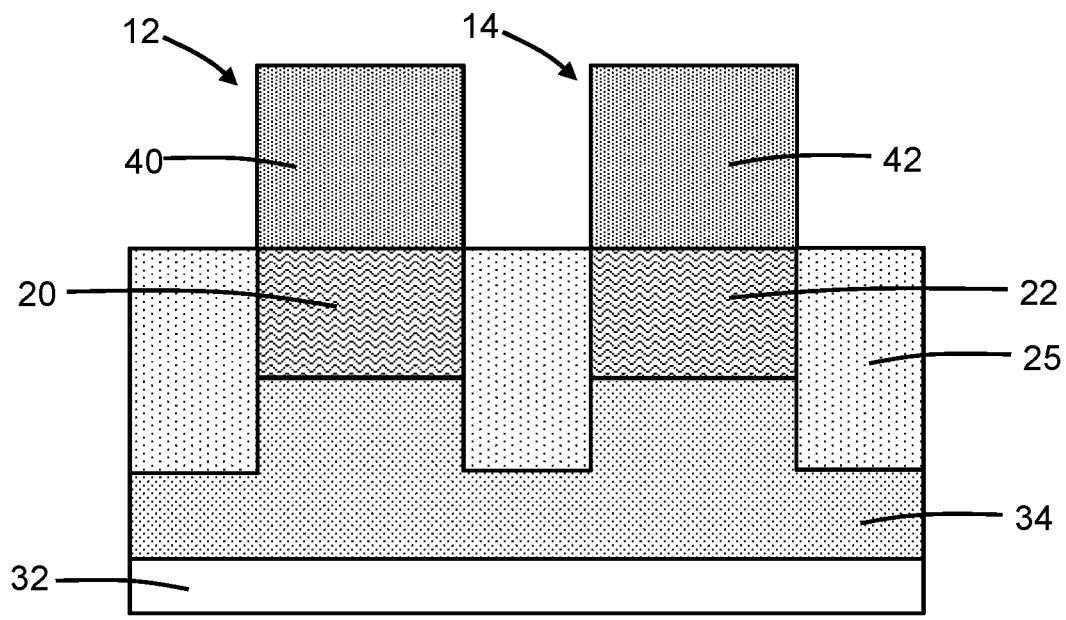
FIG. 2 is a cross-sectional view taken generally along line 2-2 in FIG. 1.
Figure 2A:
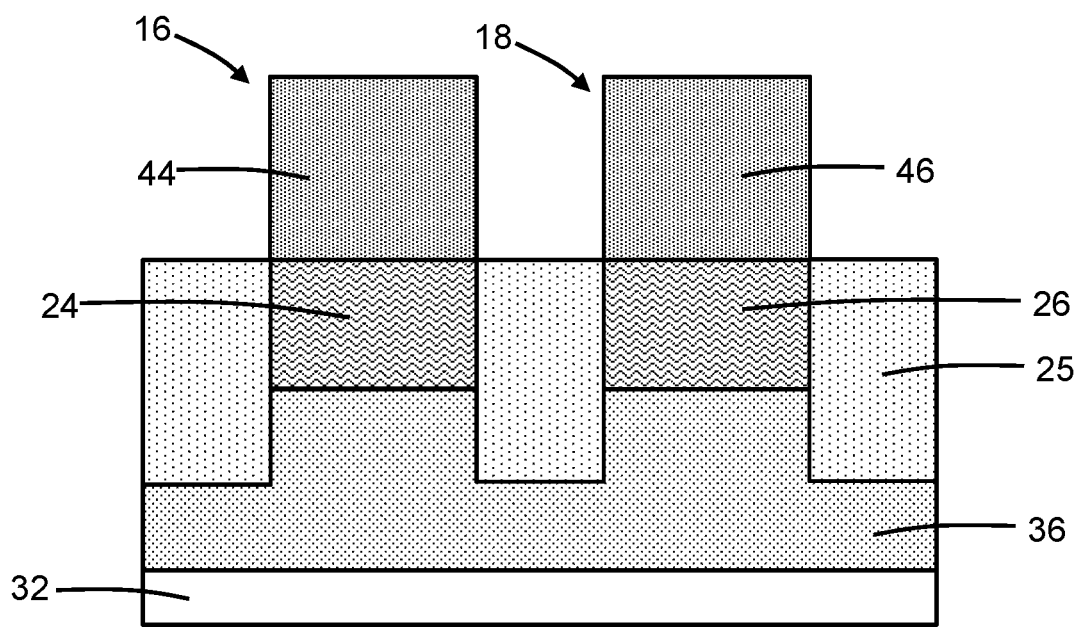
FIG. 2A is a cross-sectional view taken generally along line 2A-2A in FIG. 1.
Figure 4:
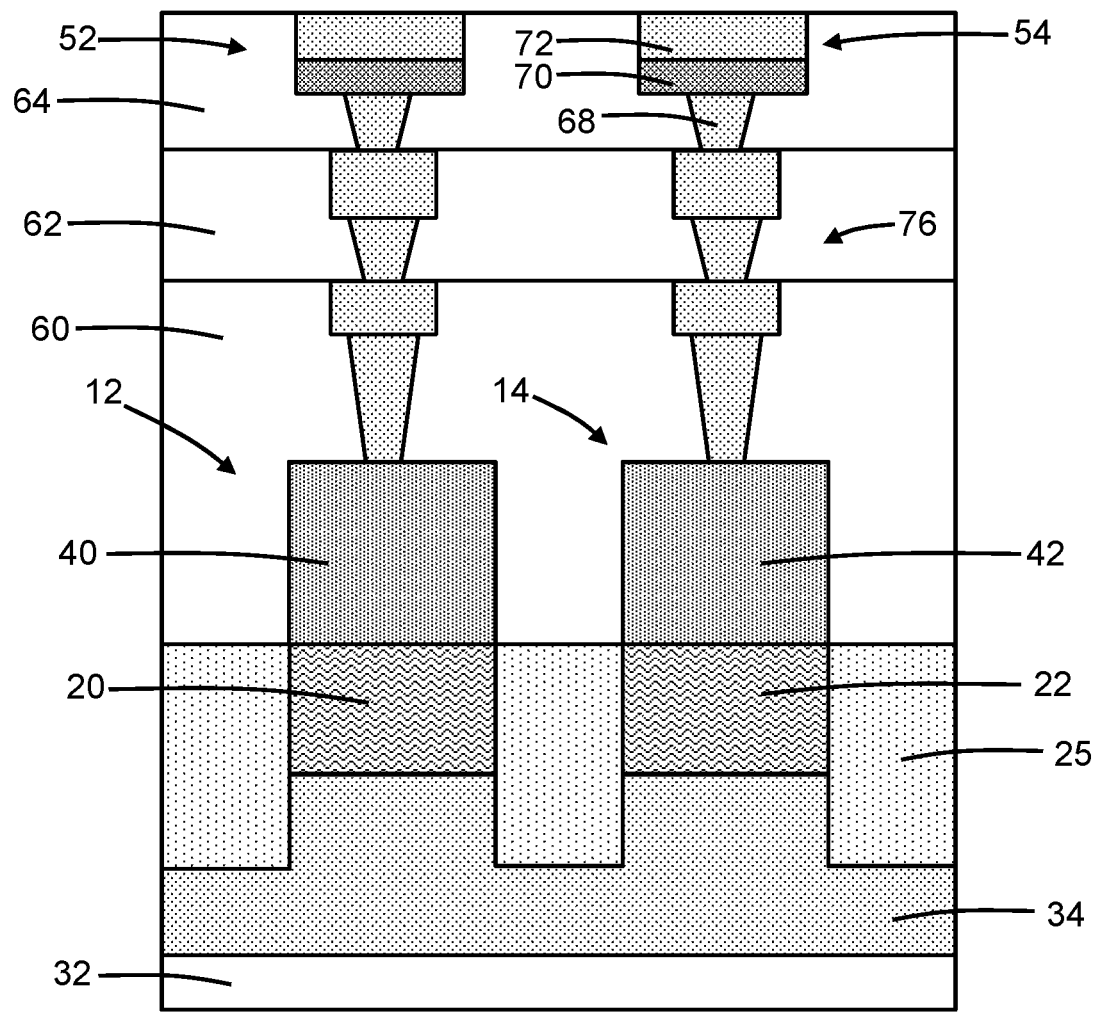
FIGS. 4, 4A are cross-sectional views of the structure at a fabrication stage subsequent to FIG. 1.
Figure 4A:
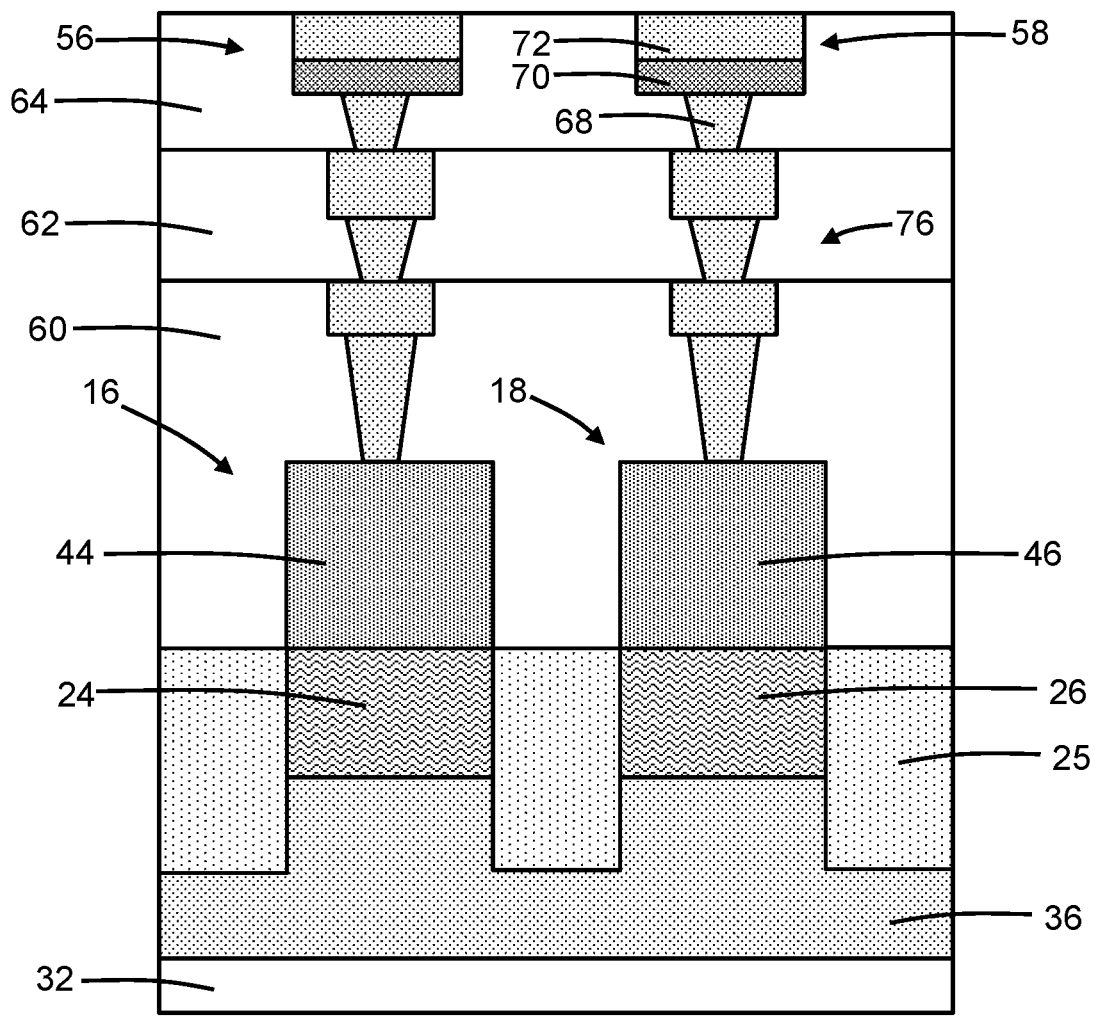

With reference to FIG. 4, 4A in which like reference numerals refer to like features in FIGS. 2, 2A and at a fabrication stage subsequent to FIG. 1, an interconnect structure may be formed over the bipolar junction transistors 12, 14, 16, 18. The interconnect structure may include dielectric layers 60, 62, 64 arranged in a layer stack defining multiple metallization levels. The dielectric layers 60, 62, 64 may be comprised of a dielectric material, such as silicon dioxide or a low-k dielectric material, that is an electrical insulator.

Resistive memory elements 52, 54, 56, 58 may be formed as representative non-volatile memory elements in the interconnect structure. The resistive memory elements 52, 54, 56, 58 are respectively coupled to the bipolar junction transistors 12, 14, 16, 18 to define different bitcells of the resistive random-access memory device, and the bipolar junction transistors 12, 14, 16, 18 provide access transistors for accessing the bitcells. The well 34 may define a word line of the resistive random-access memory device for accessing the bipolar junction transistors 12, 14, and the well 36 may define another word line of the resistive random-access memory device for accessing the bipolar junction transistors 16, 18. The wells 34, 36 may be connected by a bus to peripheral circuits that include, for example, word line drivers. The base lines 78, 80 may define bit lines of the resistive random-access memory device. The base lines 78, 80 may be connected by a bus to peripheral circuits that include, for example, bit line drivers, a multiplexer, and a sense amplifier. The bit lines defined by the base lines 78, 80 may be aligned orthogonal to the word lines defined by the wells 34, 36, which enables connections to be established to the bipolar junction transistors 12, 14, 16, 18 at edges of the array for reading, writing, and erasing the resistive memory elements 52, 54, 56, 58.

The resistive memory elements 52, 54, 56, 58 may arranged in an array that is characterized by rows and columns and that may be spatially coordinated with the array of bipolar junction transistors 12, 14, 16, 18. Each of the resistive memory elements 52, 54, 56, 58 includes a bottom electrode 68, a top electrode 72, and a switching layer 70 positioned between the bottom electrode 68 and the top electrode 72. The bottom electrodes 68 may define respective cathodes of the resistive memory elements 52, 54, 56, 58, and the top electrodes 72 may define respective anodes of the resistive memory elements 52, 54, 56, 58. Each bottom electrode 68 comprised of a metal, such as tantalum, titanium nitride, tantalum nitride, or a combination thereof. Each switching layer 70 may be comprised of a metal oxide, such as hafnium oxide, magnesium oxide, tantalum oxide, titanium oxide, or aluminum oxide, or a dielectric material, such as silicon nitride or silicon dioxide. Each top electrode 72 may be comprised of a metal, such as tungsten, titanium nitride, tantalum nitride, or platinum. The interconnect structure may include vertical interconnections 76 defined by a stack of contacts, via plugs, and metal features that physically and electrically connect the emitter 40 of the bipolar junction transistor 12 to the bottom electrode 68 of the resistive memory element 52, the emitter 42 of the bipolar junction transistor 14 to the bottom electrode 68 of the resistive memory element 54, the emitter 44 of the bipolar junction transistor 16 to the bottom electrode 68 of the resistive memory element 56, and the emitter 46 of the bipolar junction transistor 18 to the bottom electrode 68 of the resistive memory element 58.

The structure 10 for the resistive random-access memory device may be expanded to include additional bipolar junction transistors and additional resistive memory elements. In that regard, the expanded array may include additional wells arranged adjacent to the wells 34, 36, additional base lines arranged adjacent to the base lines 78, 80, and additional emitters at the intersections of the additional base lines and additional wells. The number of resistive memory elements in the expanded array may be increased commensurate with the increased number of bipolar junction transistors. In an alternative embodiment, the resistive memory elements 52, 54, 56, 58 may be replaced by a different non-volatile memory elements, such as magnetoresistive memory elements.

Figure 5:
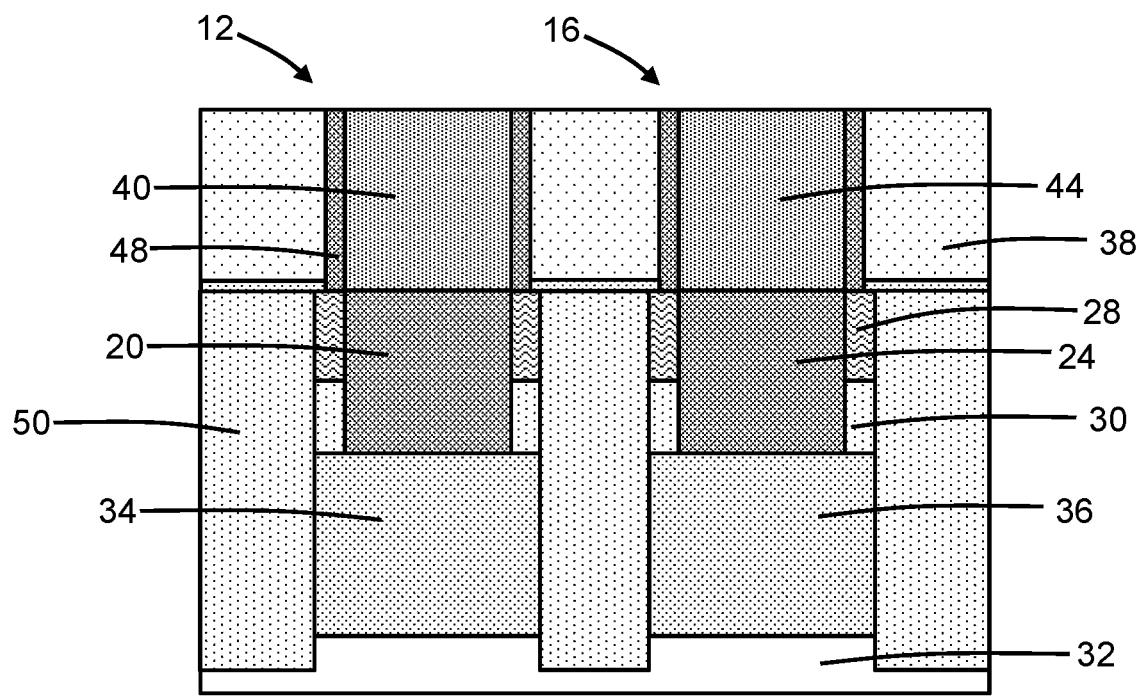
FIGS. 5, 5A are cross-sectional views of a structure in accordance with alternative embodiments of the invention.
Figure 5A:
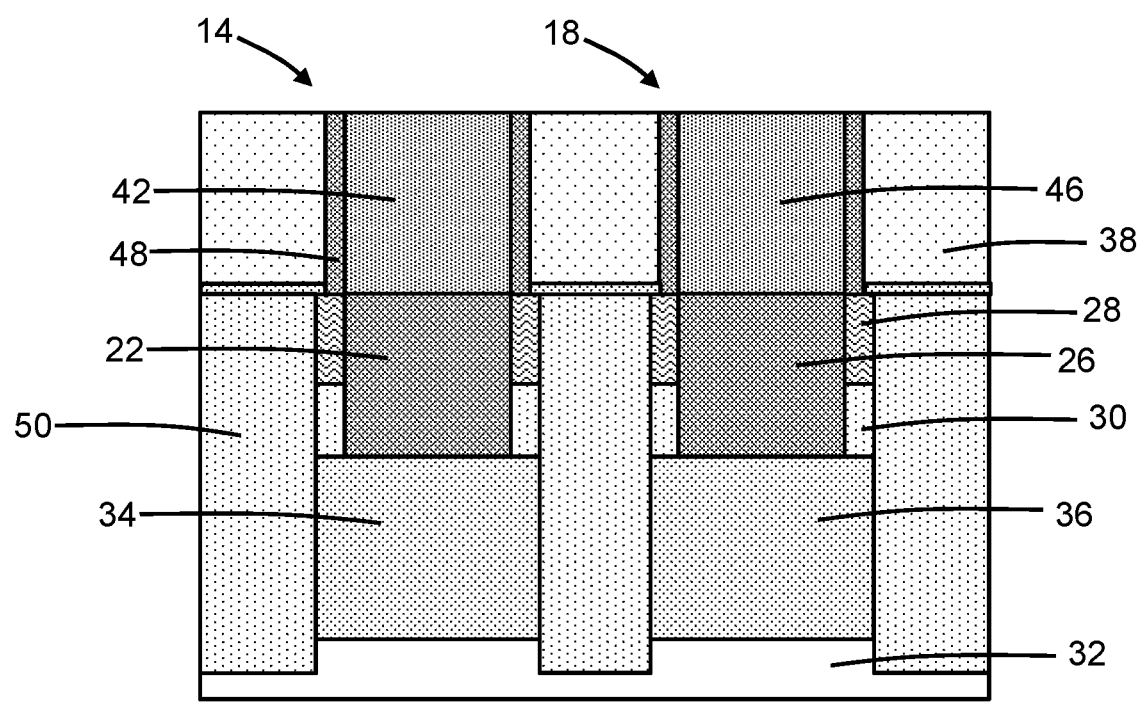

With reference to FIGS. 5, 5A and in accordance with alternative embodiments of the invention, trench isolation regions 50 may be formed in the spaces between the wells 34, 36. The trench isolation regions 50 may extend to a greater depth in the substrate 32 than the wells 34, 36. The trench isolation regions 50, which are comprised of a dielectric material, such as silicon dioxide, may be formed along with the trench isolation regions 25. One of the trench isolation regions 50 is positioned in a lateral direction between the well 34 and the well 36 to electrically isolate the well 34 from the well 36.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate a range of +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction in the frame of reference perpendicular to the horizontal, as just defined. The term "lateral" refers to a direction in the frame of reference within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features may "overlap" if a feature extends over, and covers a part of, another feature.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
a semiconductor layer including a first section;
a substrate;
a dielectric layer disposed between the semiconductor layer and the substrate;
a first bipolar junction transistor including a first collector in the substrate, a first emitter, and a first base layer positioned between the first collector and the first emitter, the first base layer extending through the dielectric layer from the first emitter to the first collector;
a second bipolar junction transistor including a second collector in the substrate, a second emitter, and a second base layer positioned between the second collector and the second emitter, the second base layer extending through the dielectric layer from the second emitter to the second collector, and the second base layer connected to the first base layer by the first section of the semiconductor layer to define a first base line; and
a dummy gate structure positioned between the first emitter and the second emitter.

2. The structure of claim 1 further comprising:
a first well in the substrate; and
a second well in the substrate,
wherein the first collector is a portion of the first well, and the second collector is a portion of the second well.

3. The structure of claim 2 wherein the first well is separated from the second well by a portion of the substrate.

4. The structure of claim 3 wherein the first well and the second well have n-type conductivity, and the portion of the substrate has p-type conductivity.

5. The structure of claim 2 further comprising:
a trench isolation region extending through the semiconductor layer and the dielectric layer into the substrate, the trench isolation region positioned between the first well and the second well.

6. The structure of claim 2 further comprising:
a third bipolar junction transistor including a third collector in the substrate, a third emitter, and a third base layer, the third base layer extending through the dielectric layer from the third emitter to the third collector; and
a trench isolation region positioned between the first base layer and the third base layer.

7. The structure of claim 6 wherein the trench isolation region extends into the first well.

8. The structure of claim 6 wherein the trench isolation region is positioned in a lateral direction between the first emitter and the third emitter.

9. The structure of claim 2 wherein the first well and the second well are longitudinally aligned orthogonal to the first base line.

10. The structure of claim 1 wherein the dummy gate structure is positioned on the first section of the semiconductor layer.

11. The structure of claim 1 further comprising:
a first memory element connected to the first emitter of the first bipolar junction transistor; and
a second memory element connected to the second emitter of the second bipolar junction transistor.

12. The structure of claim 11 further comprising:
an interconnect structure over the first bipolar junction transistor and the second bipolar junction transistor, the interconnect structure including a plurality of dielectric layers in a layer stack,
wherein the first memory element and the second memory element are positioned in the interconnect structure.

13. The structure of claim 11 wherein the first memory element and the second memory element each include a first electrode, a second electrode, and a switching layer positioned between the first electrode and the second electrode.

14. A structure comprising:
a semiconductor layer including a first section and a second section;
a substrate;
a dielectric layer disposed between the semiconductor layer and the substrate;
a first well in the substrate;
a second well in the substrate;
a first bipolar junction transistor including a first collector in the substrate, a first emitter, and a first base layer positioned between the first collector and the first emitter, the first base layer extending through the dielectric layer from the first emitter to the first collector;
a second bipolar junction transistor including a second collector in the substrate, a second emitter, and a second base layer positioned between the second collector and the second emitter, the second base layer extending through the dielectric layer from the second emitter to the second collector, and the second base layer connected to the first base layer by the first section of the semiconductor layer to define a first base line;
a third bipolar junction transistor positioned adjacent to the first bipolar junction transistor, the third bipolar junction transistor including a third collector in the substrate, a third emitter, and a third base layer, and the third base layer extending through the dielectric layer from the third emitter to the third collector; and
a fourth bipolar junction transistor including a fourth collector in the substrate, a fourth emitter, and a fourth base layer positioned between the fourth collector and the fourth emitter, the fourth base layer extending through the dielectric layer from the fourth emitter to the fourth collector, and the fourth base layer connected to the third base layer by the second section of the semiconductor layer to define a second base line,
wherein the first collector and the third collector are portions of the first well, and the second collector and the fourth collector are portions of the second well.

15. The structure of claim 14 further comprising:
a trench isolation region positioned between the first base line and the second base line.

16. The structure of claim 1 wherein the first collector, the first emitter, the second collector, and the second emitter have n-type conductivity, and the first base layer and the second base layer have p-type conductivity.

17. A method comprising:
forming a first bipolar junction transistor including a first collector in a substrate, a first emitter, and a first base layer positioned between the first collector and the first emitter, wherein a dielectric layer is disposed between a semiconductor layer and the substrate, and the first base layer extends through the dielectric layer from the first emitter to the first collector; and
forming a second bipolar junction transistor including a second collector in the substrate, a second emitter, and a second base layer positioned between the second collector and the second emitter, wherein the second base layer extends through the dielectric layer from the second emitter to the second collector, and the second base layer is connected to the first base layer by a section of the semiconductor layer to define a base line,
wherein a dummy gate structure is positioned between the first emitter and the second emitter.

18. The structure of claim 14 further comprising:
a first memory element connected to the first emitter of the first bipolar junction transistor;
a second memory element connected to the second emitter of the second bipolar junction transistor;
a third memory element connected to the third emitter of the third bipolar junction transistor; and
a fourth memory element connected to the fourth emitter of the fourth bipolar junction transistor.

19. The structure of claim 14 wherein the first well is separated from the second well by a portion of the substrate.

20. The structure of claim 14 further comprising:
a trench isolation region extending through the semiconductor layer and the dielectric layer into the substrate, the trench isolation region positioned between the first well and the second well.

* * * * *